United States Patent [19]
Nakatani et al.

[11] Patent Number: 5,165,058
[45] Date of Patent: Nov. 17, 1992

[54] VOLTAGE COMPARATOR WITH SAMPLE HOLD CIRCUIT

[75] Inventors: Yuuichi Nakatani, Mitaka; Hironori Miyake, Yokohama, both of Japan

[73] Assignee: Motorola, Inc., Schaumburg, Ill.

[21] Appl. No.: 548,529

[22] Filed: Jul. 5, 1990

[51] Int. Cl.⁵ ............................................. H03M 1/34
[52] U.S. Cl. .................................. 341/158; 341/122; 307/355
[58] Field of Search ................ 341/122, 158, 172; 307/353, 355, 246, 240

[56] References Cited

U.S. PATENT DOCUMENTS

| | | | |
|---|---|---|---|
| 4,097,753 | 6/1978 | Cook et al. ........................ | 341/172 |
| 4,539,551 | 9/1985 | Fujita ................................. | 341/158 |
| 4,691,189 | 9/1987 | Dingwall et al. ................. | 341/122 |
| 4,845,383 | 7/1989 | Iida .................................... | 307/355 |
| 4,897,655 | 1/1990 | Zazzu et al. ...................... | 341/159 |

*Primary Examiner*—A. D. Pellinen
*Assistant Examiner*—Marc S. Hoff
*Attorney, Agent, or Firm*—Michael D. Bingham; Eugene A. Parsons

[57] ABSTRACT

A chopper type voltage comparator, as used in analog-to-digital converters, includes an inverter with a switch coupled between the output and an input node and a capacitor coupling the input node to a comparator input node. A signal input terminal and at least one reference voltage input terminal are connected to the comparator input terminal by alternately operated switches. A sample-hold circuit is connected to the comparator input node to overcome the effects of the switches on the reference voltage.

11 Claims, 3 Drawing Sheets

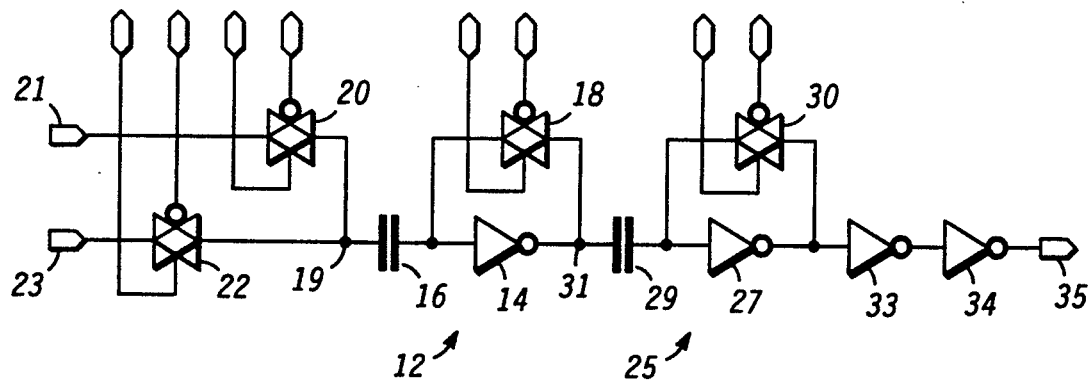
FIG. 1
—PRIOR ART—
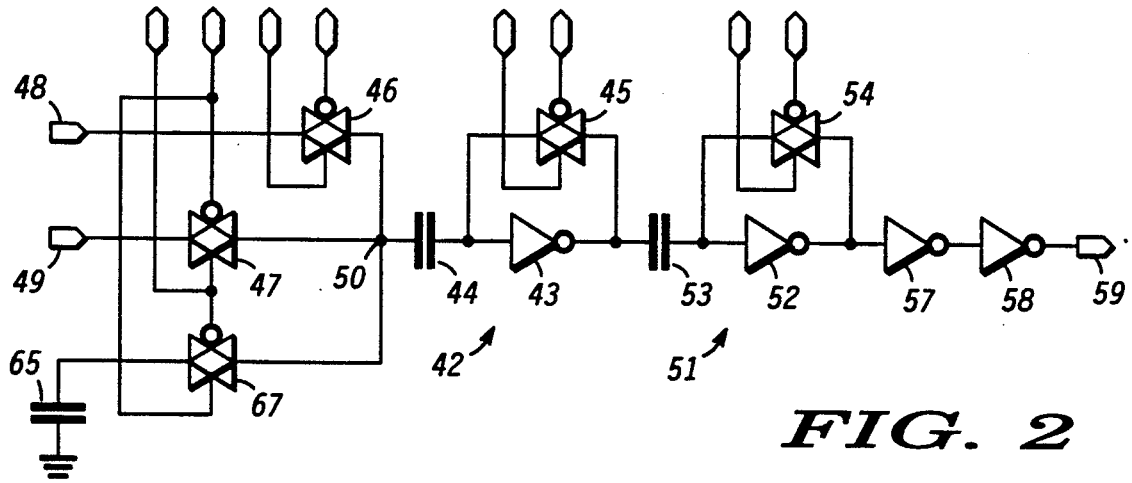
FIG. 2
FIG. 3
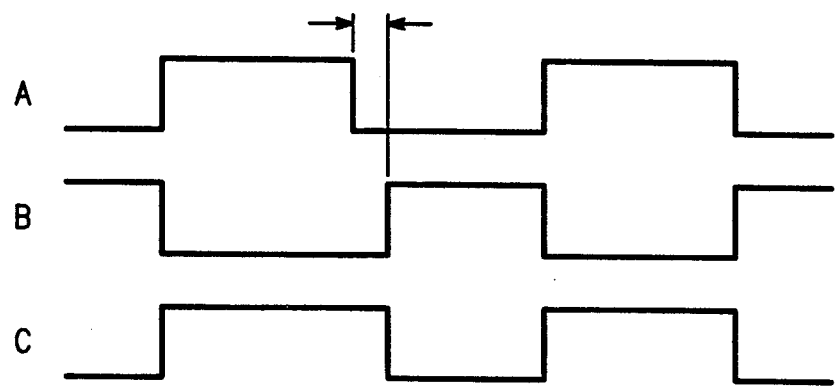

VOLTAGE COMPARATOR WITH SAMPLE HOLD CIRCUIT

The present invention pertains to chopper type voltage comparators for use in analog-to-digital (A/D) converters.

BACKGROUND OF THE INVENTION

Typically, a chopper type voltage comparator includes one or more inverter stages with signals coupled to the inputs thereof by coupling capacitors and three or four switches, generally of the transmission gate type. The transmission gates are used to supply an input signal and at least one reference signal to an input node of the comparator and to supply a feedback signal around one or two of the inverters. If the comparator is to be used in an analog-to-digital converter, it must be integrated into a single circuit on a semiconductor chip and to do this integration some type of semiconductor switches, such as the transmission gates, must be used.

The major problem with any of the semiconductor switches, and especially transmission gates, is the parasitic capacitance between the input/output terminals and the control terminals. The parasitic capacitance has a tendency to feed portions of the control signals from the control terminals to the input/output terminals, especially at very high frequencies. This problem can cause serious errors in analog-to-digital converters especially when the input and reference voltages are very small or the comparison becomes extremely close.

SUMMARY OF THE INVENTION

It is an object of the present invention to provide a new and improved chopper type voltage comparator.

It is a further object of the present invention to provide a new and improved chopper type voltage comparator that can produce extremely reliable voltage comparisons.

It is still a further object of the present invention to provide a new and improved analog-to-digital converter utilizing the new and improved voltage comparator, which improved converter is substantially as simple to manufacture as the prior converters.

These and other objects are realized in a chopper type voltage comparator including an inverter with a switch coupled between an output and an input node thereof and a capacitor coupling the input node to a comparator input node and a pair of switches coupling a signal input terminal and at least one reference voltage input terminal to the comparator input node, and further including a sample hold circuit connected to the comparator input node by a switch. Further, the invention is embodied in an analog-to-digital converter using a plurality of the chopper type voltage comparators with a single sample hold circuit.

BRIEF DESCRIPTION OF THE DRAWINGS

Referring to the drawings:

FIG. 1 illustrates a schematic diagram of a typical chopper type voltage comparator;

FIG. 2 illustrates a schematic diagram of a typical chopper type voltage comparator embodying the present invention;

FIG. 3 illustrates the waveforms and timing of clock signals applied to various inputs of the voltage comparator illustrated in FIG. 2;

DESCRIPTION OF THE PREFERRED EMBODIMENTS

Figure 4:
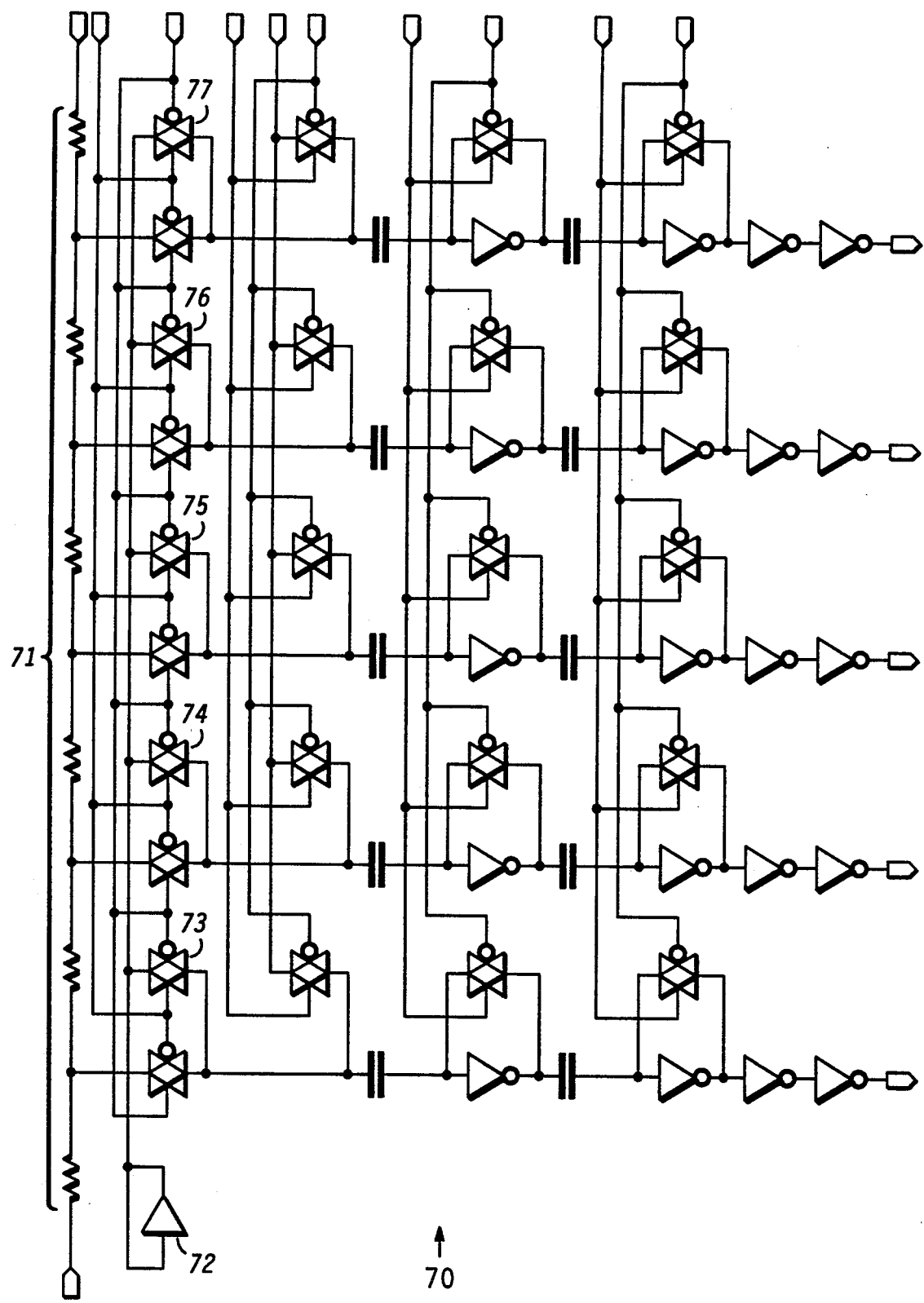
FIG. 4 illustrates an analog-to-digital converter incorporating the voltage comparator of FIG. 2.

Referring specifically to FIG. 1, a typical two stage, chopper type voltage comparator 10 is illustrated. A first stage 12 of voltage comparator 10 includes an inverter 14 and a coupling capacitor 16 connected to an input thereof. A transmission gate switch 18 is connected from the output to the input of inverter 14. One terminal of capacitor 16 is connected to the input of inverter 14 and the other terminal is connected to a comparator input node 19 of the first stage 12. A transmission gate switch 20 is connected between the node 19 and a signal input terminal 21. A transmission gate switch 22 is connected between the node 19 and a reference voltage input terminal 23.

Comparator 10 has a second stage 25 which includes an inverter 27 and a coupling capacitor 29 connected to an input of inverter 27. A transmission gate switch 30 is connected from the output to the input of inverter 25. One terminal of capacitor 29 is connected to the input of inverter 27 and the other terminal is connected to a comparator input node 31 of the second stage 25. Voltage comparator 10 may have additional inverters 33 and 34 connected in series with the second stage 25, if additional amplification of the output signals is desired. The final output signal is available at an output terminal 35.

In the operation of voltage comparator 10, switches 18, 20 and 30 are closed while switch 22 remains open. An unknown signal voltage on input terminal 21 is supplied to voltage comparator 10 (sampled) and stages 12 and 25 are autozeroed to their toggle points. That is, switches 18 and 30 are closed so that first stage 12 and second stage 25 are zeroed at the unknown signal voltage, which is the toggle point for further operation. Switches 18, 20 and 30 are then opened and switch 22 is closed, which supplies the reference voltage on input terminal 23 to node 19. Since stages 12 and 25 are at their toggle point, if the reference voltage is greater than the unknown signal voltage stages 12 and 25 will toggle in a first direction and a first signal, in this example a positive output, will be available at output 35. If the reference voltage is less than the unknown signal voltage stages 12 and 25 will toggle in a second direction and a second signal, in this example ground potential, will be available at output 35. Inverters 14 and 27 operate to provide some signal gain, with one stage being on the order of 12.5 and two stages being approximately 120. Thus a comparison between the unknown signal voltage and a reference voltage is provided by voltage comparator 10 and the amount of signal gain required will determine the number of stages utilized.

The major problem with voltage comparator 10 is that normal wiring and transmission gate switches 18, 20, 22 and 30 have parasitic capacitances. Further, the parasitic capacitances are increased substantially by the very high operating frequencies (1 MHz to 20 MHz) of the present day analog-to-digital converters in which the voltage comparators are used. These parasitic capacitances tend to couple portions of clock signals, which are supplied to the control inputs, and other noise into the signal path. If the difference between the unknown signal voltage and the reference voltage is small, the coupling of this noise into the signal path can cause comparator 10 to toggle in the wrong direction and provide an erroneous output.

Referring to FIG. 2, a schematic diagram of a chopper type voltage comparator 40 embodying the present invention is disclosed. Voltage comparator 40 is again illustrated as a two stage voltage comparator for convenience in understanding. A first stage 42 includes an inverter 43, a coupling capacitor 44 and a transmission gate feedback switch 45. Two transmission gate switches 46 and 47 couple unknown voltage signals from a signal input terminal 48 and reference voltages from a reference voltage input terminal 49, respectively, to a comparator input node 50. A second stage 51 includes an inverter 52, a coupling capacitor 53 and a transmission gate feedback switch 54. Additional inverters 57 and 58 may be included to increase the gain at the output 59, if desired. The listed components operate as described in conjunction with comparator 10 of FIG. 1.

A sample hold circuit, which in this embodiment is a capacitor 65, has one terminal connected to ground and one terminal connected through a transmission gate switch 67 to node 50. The control terminals of transmission gate switch 67 are connected to the control terminals of transmission gate 47 but in the opposite polarity so that transmission gate switches 47 and 67 operate 180 degrees out of phase. A timing chart for the operation of transmission gate switches 45, 46, 47, 54 and 67 is shown in FIG. 3. Waveforms A, B and C are the clock signals applied to the transmission gate switches, with waveform A being simultaneously applied to switches 46, 45 and 54, waveform B being applied to switch 47 and waveform C being applied to switch 67.

The operation of the circuit of FIG. 2 is as follows. Switches 46, 45 and 54 are closed by the application of clock waveform A to the control terminals thereof. With these switches closed, stages 42 and 51 are autozeroed at the voltage level of the unknown input signal on terminal 48. Clock waveform C also causes switch 67 to close so that capacitor 65 charges to the voltage level of the unknown input signal on terminal 48. Waveform A changes a short time before waveforms B and C change and causes switches 46, 45 and 54 to open a short time before waveforms B and C change. This insures smooth switching from the unknown input signal to the reference signal with no possibility of an inadvertent short being produced from input terminal 48 to input terminal 49 by the simultaneous operation of switches 46 and 47.

After switches 46, 45 and 54 have opened and the circuit has settled, waveform B changes and causes switch 47 to close. It should be noted that switch 67 remains closed during the time that switches 46, 45 and 54 are changing from closed to open. Since capacitor 65 is charged to the voltage value of the unknown input signal, the entire comparator circuit is held at the autozeroed toggle point during the switching of switches 46, 45 and 54. Also, switch 67 changes with switch 47, so that the stored unknown voltage is removed as the reference voltage from input terminal 49 is applied. Thus, any noise introduced by the operation of any of the switches has no effect on the operation of the circuit and is effectively removed by capacitor 65 and/or the unique operation thereof. The comparator, which remains autozeroed at the toggle point until the instant that the reference voltage is applied, compares the exact reference voltage to the exact unknown input voltage.

It should be noted that capacitor 65 is much larger than the coupling capacitors 44 or 53 so that it can filter or absorb any switching noises that are coupled into the circuit by stray or parasitic capacitances, while maintaining the comparator at the autozeroed toggle point. Coupling capacitors 44 and 53 are generally in the range of approximately 0.15 pF to 0.3 pF and capacitor 65 should be in the range of approximately 1.0 pF to 10 pF. In the present embodiment coupling capacitors 44 and 53 are approximately 0.3 pF and capacitor 65 is approximately 1.0 pF. Since capacitor 65 is only in the circuit during the sampling steps it does not add any capacitive loading to the reference voltage generator and, therefore, does not adversely effect the accuracy of comparator 40.

Referring to FIG. 4, an analog-to-digital converter 70 is illustrated. Converter 70 includes five comparators similar to comparator 40. As is known in the A/D converter art, the comparators operate sequentially to compare the common unknown voltage applied to each of them to the specific reference voltages applied to each of them from a reference voltage ladder 71. In this embodiment, instead of including a sample hold circuit for each of the comparators, a single sample hold circuit 72 is utilized and connected to the individual comparators by transmission gate switches 73 through 77. Sample hold circuit 72 can be any circuit that can sample and hold the unknown input voltage, from a complex switching circuit to a simple varactor or capacitor.

Figure 5:
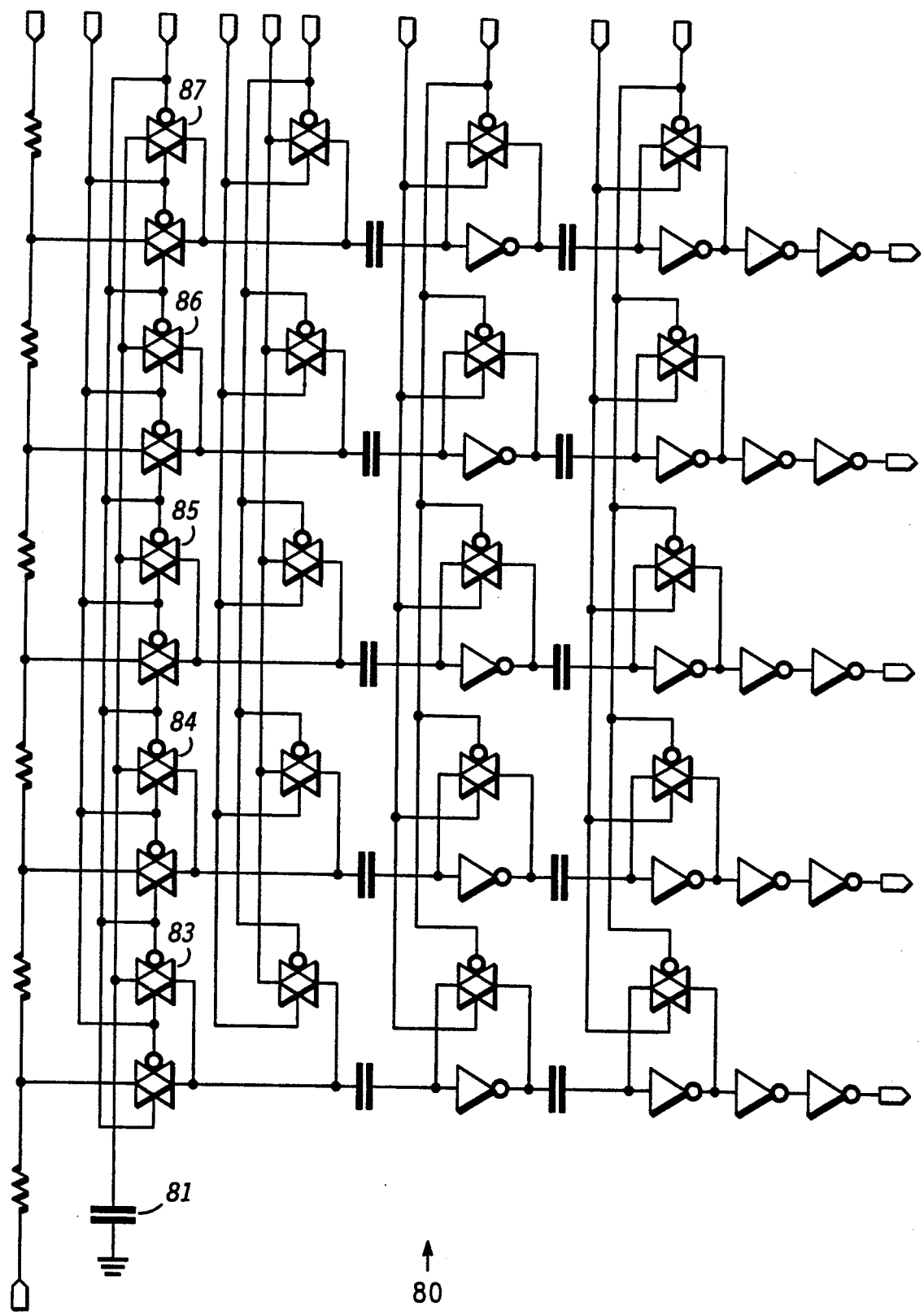
FIG. 5 illustrates an analog-to-digital converter similar to that illustrated in FIG. 4, incorporating another embodiment of the invention.

Referring to FIG. 5, an embodiment of an A/D converter 80 similar to that illustrated in FIG. 4 is shown. In this embodiment the sample hold circuit is a simple capacitor 81 having one terminal connected to ground and the other terminal connected to an input of each of a plurality of transmission gate switches 83 through 87. The operation is the same as described in conjunction with converter 70 of FIG. 4. As described in conjunction with single comparator 40, capacitor 81 should be much larger than any of the coupling capacitors in the five comparators. If other types of sample hold circuits are utilized they should include a holding characteristic that is large compared to the storage capabilities of the coupling capacitors.

Thus, a new and improved voltage comparator is disclosed which is more reliable but which is not substantially more expensive or complicated to manufacture. Further, a new and improved analog-to-digital converter is disclosed which is more reliable without being substantially more complicated to manufacture.

While we have shown and described specific embodiments of this invention, further modifications and improvements will occur to those skilled in the art. We desire it to be understood, therefore, that this invention is not limited to the particular forms shown and we intend in the appended claims to cover all modifications which do not depart from the spirit and scope of this invention.

What I claim is:

1. In a chopper type voltage comparator including an inverter with a first switch coupled between an output and an input node thereof and a capacitor coupling the input node to a comparator input node and a pair of switches alternately coupling a signal input terminal and at least one reference voltage input terminal to the comparator input node, the improvement comprising a sample hold circuit connected to the comparator input node by a switch during periods when the first switch and one of the pair of switches are operating and disconnected from the comparator input node by the switch when the other of the pair of switches is operating.

2. A chopper type voltage comparator as claimed in claim 1 wherein the sample hold circuit includes a capacitor.

3. A chopper type voltage comparator as claimed in claim 2 wherein the capacitance of the capacitor in the sample circuit is much greater than the capacitance of the capacitor coupling the inverter input node to the comparator input node.

4. A chopper type voltage comparator as claimed in claim 1 wherein the switch connecting the sample hold circuit to the comparator input node and the switch connecting the reference voltage input terminal to the comparator input node operate 180 degrees out of phase with each other.

5. A chopper type voltage comparator comprising:
   an autozeroing stage including an inverter with an input and an output node and a first switch coupled between the output and the input nodes, a comparator input node, and a coupling capacitor having one terminal connected to the input node of said inverter and another terminal connected to the comparator input node;
   a signal input terminal connected to the comparator input node by a second switch and a reference voltage input terminal connected to the comparator input node by a third switch, the first and second switches operating in phase and the third switch operating out of phase and closing a predetermined time after the first and second switches open; and
   a sample hold circuit connected to the comparator input node by a fourth switch, said fourth switch operating 180 degrees out of phase with the third switch.

6. A chopper type voltage comparator as claimed in claim 5 wherein the sample hold circuit includes a capacitor having a capacitance substantially larger than the capacitance of the coupling capacitor.

7. An analog-to-digital converter comprising:
   a plurality of chopper type voltage comparators each including an inverter with an input node, an output and a first switch coupled between the output and the input node, a comparator input node, a coupling capacitor having one terminal connected to the input node of said inverter and another terminal connected to the comparator input node, a signal input terminal connected to the comparator input node by a second switch and a reference voltage input terminal connected to the comparator input node by a third switch, the first and second switches operating in phase and the third switch operating out of phase and closing a predetermined time after the first and second switches open; and
   a sample hold circuit connected to the comparator input node of each of said plurality of comparators by a plurality of switches, each of said plurality of switches operating 180 degrees out of phase with the third switch of the associated comparator.

8. An analog-to-digital converter as claimed in claim 7 wherein the sample hold circuit includes a capacitor substantially larger than any of the coupling capacitors in the plurality of comparators.

9. In a chopper type voltage comparator including an inverter with an input node and a first switch coupled from the output of the inverter to the input node thereof, a comparator input node, a coupling capacitor having one terminal connected to the input node of the inverter and another terminal connected to the comparator input node, a first input terminal connected to the comparator input node by a second switch and a second input terminal connected to the comparator input node by a third switch, a method of reducing errors produced by parasitic capacitances in the comparator comprising the steps of:
   closing the first and second switches and applying a first voltage to the comparator input node to autozero the inverter to toggle at the value of the first voltage;
   storing the first voltage;
   opening the first and second switches while applying the stored voltage to the comparator input node; and
   closing the third switch and applying a second voltage to the comparator input node for comparison with the first voltage and simultaneously removing the stored voltage from the comparator input node.

10. A method as claimed in claim 9 wherein the first voltage is an unknown voltage and the second voltage is a reference voltage.

11. A method as claimed in claim 9 wherein there is sufficient time between the opening of the first and second switches and the closing of the third switch to prevent the formation of an electrical circuit through the first and third switches.

* * * * *